United States Patent
Lue

(10) Patent No.: US 11,081,182 B2
(45) Date of Patent: Aug. 3, 2021

(54) INTEGRATED CIRCUIT AND COMPUTING METHOD THEREOF

(71) Applicant: MACRONIX International Co., Ltd., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 23 days.

(21) Appl. No.: 16/667,536

(22) Filed: Oct. 29, 2019

(65) Prior Publication Data

US 2021/0125671 A1 Apr. 29, 2021

(51) Int. Cl.
*G11C 16/10* (2006.01)
*G11C 16/24* (2006.01)
*G11C 16/08* (2006.01)
*G11C 16/04* (2006.01)

(52) U.S. Cl.
CPC .......... *G11C 16/10* (2013.01); *G11C 16/0483* (2013.01); *G11C 16/08* (2013.01); *G11C 16/24* (2013.01)

(58) Field of Classification Search
CPC ...................................................... G11C 16/10
USPC ..................................................... 365/185.12
See application file for complete search history.

(56) References Cited

U.S. PATENT DOCUMENTS

| | | | |
|---|---|---|---|
| 8,432,719 B2 | 4/2013 | Lue | |
| 8,630,114 B2 | 1/2014 | Lue | |
| 9,430,751 B2 | 8/2016 | Wong et al. | |
| 10,242,737 B1 | 3/2019 | Lin et al. | |
| 10,381,074 B1* | 8/2019 | Kim | G06N 3/063 |
| 10,891,222 B2* | 1/2021 | Wei | G11C 11/4082 |
| 2013/0003459 A1 | 1/2013 | Ulriksson et al. | |
| 2018/0143762 A1* | 5/2018 | Kim | G06F 3/0679 |
| 2019/0392316 A1* | 12/2019 | Kim | G11C 7/1006 |
| 2020/0311523 A1* | 10/2020 | Hoang | G11C 11/54 |

FOREIGN PATENT DOCUMENTS

TW 201935325 9/2019

OTHER PUBLICATIONS

Anni Wang, et al.,"Three-Dimensional nand Flash for Vector-Matrix Multiplication", retrieved on Feb. 6, 2020.*

(Continued)

*Primary Examiner* — Muna A Techane
(74) *Attorney, Agent, or Firm* — J.C. Patents

(57) ABSTRACT

An integrated circuit and a computing method thereof are provided. The integrated circuit includes a memory array, word lines, bit lines and a page buffer. The memory array includes memory cells, each configured to be programmed with a weight. The word lines respectively connect a row of the memory cells. The bit lines are respectively connected with a column of the memory cells that are connected in series. More than one of the bit lines in a block of the memory array or more than one of the word lines in multiple blocks of the memory array are configured to receive input voltages. The memory cells receiving the input voltages are configured to multiply the weights stored therein and the received input voltages. The page buffer is coupled to the memory array, and configured to sense products of the weights and the input voltages.

20 Claims, 5 Drawing Sheets

(56) References Cited

OTHER PUBLICATIONS

Gonugondla Sujan K, et al.,"Energy-Efficient Deep In-memory Architecture for NAND Flash Memories", 2018 EEE International Symposium On iCIRCUITS and Systems (ISCAS), May 27, 2018, pp. 1-5.*
"Office Action of Taiwan Counterpart Application", dated Apr. 17, 2020, p. 1-p. 5.
Panni Wang, et al.,"Three-Dimensional nand Flash for Vector-Matrix Multiplication", retrieved on Feb. 6, 2020, Available at: https://ieeexplore.ieee.org/ielx7/92/8672976/08571188.pdf?tp=&arnumber=8571188&isnumber=8672976&ref=aHR0cHM6Ly9pZNVIeHBsb3JlLmllZWI/IUub3JnL2RvY3VtZW50Lzg1NzExODg=.
Gonugondla Sujan K, et al.,"Energy-Efficient Deep In-memory Architecture for NAND Flash Memories", 2018 IEEE International Symposium on iCIRCUITS and Systems (ISCAS), May 27, 2018, pp. 1-5.
"Search Report of Europe Counterpart Application", dated Feb. 14, 2020, p. 1-p. 10.

\* cited by examiner

INTEGRATED CIRCUIT AND COMPUTING METHOD THEREOF

BACKGROUND

Technical Field

The present disclosure relates to an integrated circuit and a computing method thereof, and particularly, to a memory circuit and a computing method thereof.

Description of Related Art

A conventional Von Neumann architecture of a computer keeps data storage units separate from data processing units. Shuttling information back and forth between the data storage units and the data processing units through inputs/outputs WOO and buses takes time and power, and creates a bottleneck in performance when massive data is transmitted between these units. In recent years, this problem grows fast as the data used in artificial intelligence (AI) applications has increased by orders of magnitude.

SUMMARY

Accordingly, the present disclosure provides an integrated circuit that can be operated under a memory mode and a computation mode.

According to some embodiments in the present disclosure, an integrated circuit includes a memory array, a plurality of word lines, a plurality of bit lines and a page buffer. The memory array includes a plurality of memory cells, each configured to be programmed with a weight. The plurality of word lines respectively connect a row of the plurality of memory cells. The plurality of bit lines are respectively connected with a column of the plurality of memory cells that are connected in series. More than one of the plurality of bit lines in a block of the memory array or more than one of the plurality of word lines in multiple blocks of the memory array are configured to receive input voltages, and the memory array receiving the input voltages are configured to multiply the weights stored therein and the received input voltages. The page buffer is coupled to the memory array, and configured to sense products of the weights and the input voltages.

In some embodiments, the input voltages are received by the more than one of the plurality of the bit lines in a block of the memory array, and one of the plurality of word lines in the block of the memory array is configured to receive a read voltage, whereas others of the plurality of word lines in the block of the memory array are configured to receive a pass voltage.

In some embodiments, the memory cells corresponding to the more than one of the plurality of the bit lines and the one of the plurality of word lines are configured to multiply the weights stored therein and the received input voltages, and to produce the products.

In some embodiments, the integrated circuit further includes a counter, coupled to the page buffer, and configured to sum up the products.

In some embodiments, at least two of the input voltages are different from each other.

In some embodiments, the input voltages are identical with one another.

In some embodiments, the page buffer includes a first cache and a second cache. The first cache is configured to receive first logic signals transformed from the products of the weights and the input voltages, and to be pre-written with second logic signals transformed from additional input voltages. The second cache is configured to multiply the first and second logic signals, and sum up products of the first and second logic signals In some embodiments, at least two of the additional input voltages are different from each other and transformed to different logic signals.

In some embodiments, the input voltages are received by the more than one of the plurality of word lines in multiple blocks of the memory array, the word lines in different ones of the multiple blocks of the memory array are isolated from one another, the plurality of bit lines are respectively shared by the multiple blocks of the memory array, and one of the plurality of bit lines is configured to receive a read voltage, whereas others of the plurality of bit lines are configured to receive a pass voltage.

In some embodiments, the memory cells corresponding to the more than one of the plurality of word lines and the one of the plurality of bit lines are configured to multiply the weights stored therein and the received input voltages, and to produce the products.

In some embodiments, the initial products are summed up in the one of the plurality of bit lines.

In some embodiments, the memory cells corresponding to the more than one of the plurality of word lines and the one of the plurality of bit lines have a threshold voltage greater than or equal to 0V.

In some embodiments, the memory array is a NAND flash memory array, and the plurality of memory cells are flash memory cells.

In some embodiments, an amount of the page buffer is plural, and a block of the memory array has a plurality tiles, respectively coupled with one of the page buffers.

According to some embodiments in the present disclosure, a computing method of an integrated circuit is provided. The integrated circuit comprises a memory array, a plurality of word lines, a plurality of bit lines and a page buffer, the memory array includes a plurality of memory cells, the plurality of word lines respectively connect a row of the plurality of memory cells, the plurality of bit lines are respectively connected with a column of the plurality of memory cells that are connected in series, and the page buffer is coupled to the memory array. The computing method of the integrated circuit includes: performing at least one programming operations, to write weights into the plurality of memory cells; applying input voltages to more than one of the plurality of bit lines in a block of the memory array or to more than one of the plurality of word lines in multiple blocks of the memory array, wherein the memory cells receiving the input voltages are configured to multiply the weights stored therein and the received input voltages; and summing up the products of the weights and the input voltages by the page buffer or through one of the plurality of bit lines.

In some embodiments, a cycle including the operation of applying the input voltages and the operation of summing up the products are performed multiple times.

In some embodiments, the operation of applying the input voltages in one of the cycles is followed by the operation of applying the input voltages in a subsequent one of the cycles.

In some embodiments, the operation of applying the input voltages in one of the cycles is overlapped with the operation of summing up the products in a precedent one of the cycles.

In some embodiments, the input voltages are applied to the more than one of the plurality of bit lines in a block of the memory array, and the products of the weights and the input voltages are summed up by the page buffer.

In some embodiments, the input voltages are applied to the more than one of the plurality of word lines in multiple blocks of the memory array, and the products of the weights and the input voltages are summed up through the one of the bit lines.

As above, the integrated circuit of the present disclosure can be operated under a memory mode and a computation mode. The integrated circuit includes a memory array, such as a NAND flash memory array. A sum-of-products function can be implemented by the integrated circuit, and may be used in a learning procedure of artificial intelligence applications, neuromorphic computing systems and machine learning systems. Under the memory mode, weights are written into the memory cells of the memory array. Under the computation mode, the stored weights are multiplied by input voltages transmitted to the memory cells through bit lines or word lines, and the products of the weights and the input voltages are summed up. As compared to a Von Neumann architecture that executes computation in a data processing unit (e.g., a central processing unit (CPU)) separated from a data storage unit (e.g., a memory integrated circuit), the integrated circuit in the present disclosure that can be operated under both of the memory mode and the computation mode does not require shuttling information between the data processing unit and the data storage unit. Thus, a computation speed can be significantly raised. Particularly, the page buffer used during writing the weights into the memory cells and during receiving the products of the weights and the input voltages has a wide bandwidth since it is coupled to the memory array through a large amount of the bit lines with high parallelism. Therefore, a performance bottleneck when massive data is transmitted in the integrated circuit may not occur.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
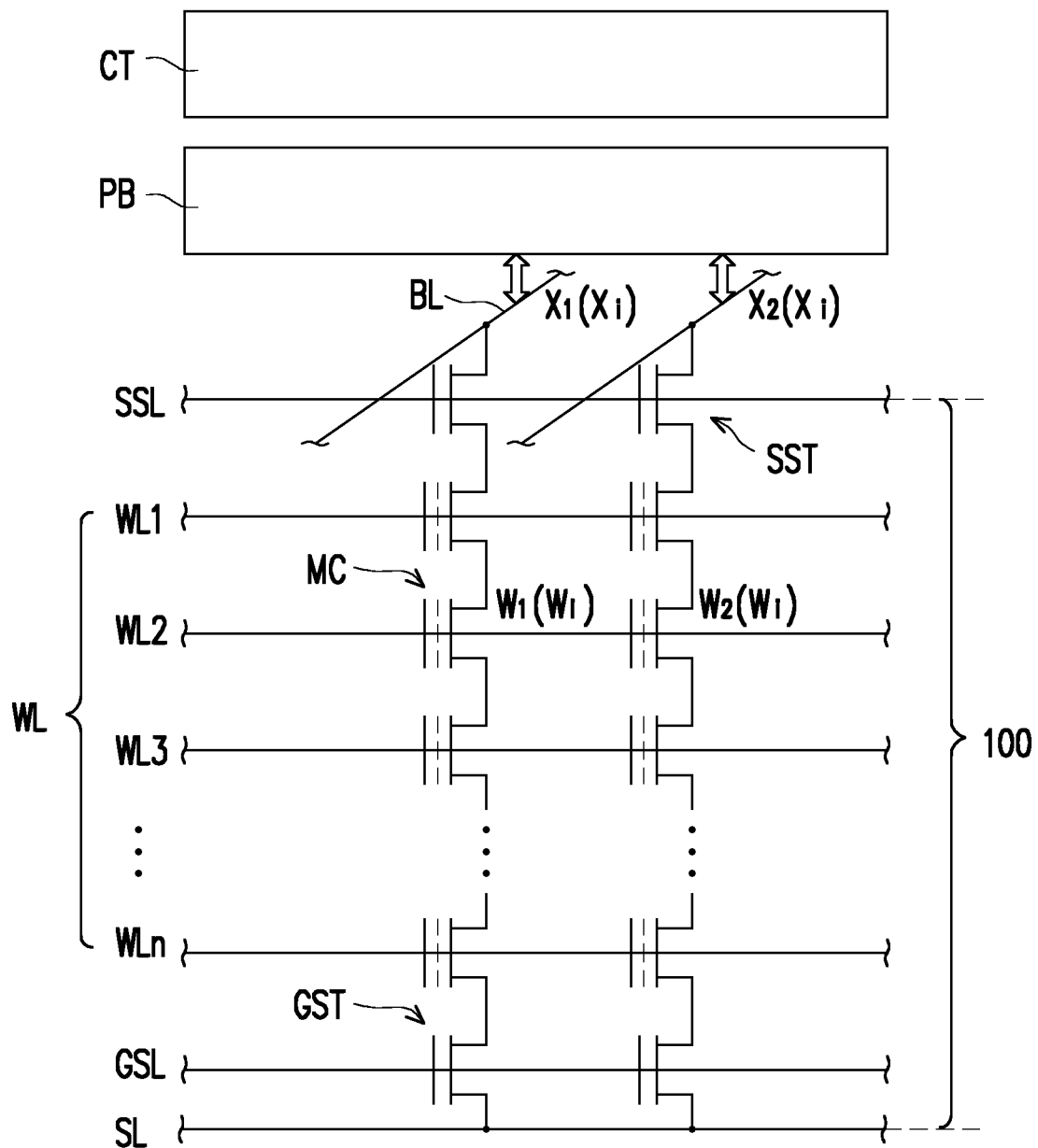
FIG. 1A is a schematic diagram illustrating an integrated circuit according to some embodiments of the present disclosure.
Figure 1B:
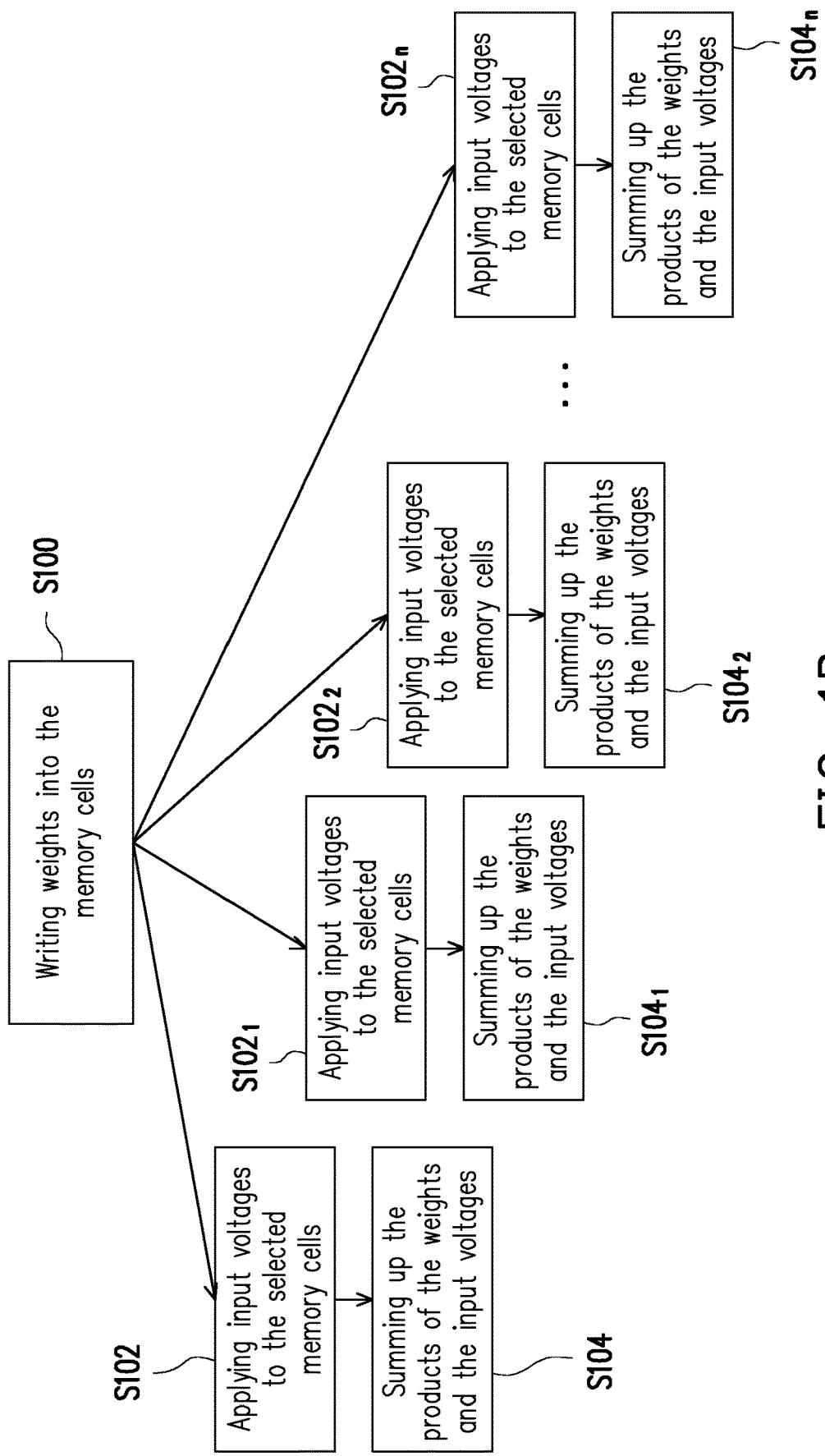
FIG. 1B is a flow diagram illustrating a computing method of the integrated circuit exemplarily shown in FIG. 1A.

FIG. 1A is a schematic diagram illustrating an integrated circuit 10 according to some embodiments of the present disclosure. FIG. 1B is a flow diagram illustrating a computing method of the integrated circuit 10 exemplarily shown in FIG. 1A.

Referring to FIG. 1A, the integrated circuit 10 may be a memory circuit, such as a non-volatile memory circuit. In some embodiments, the integrated circuit 10 is a NAND flash memory circuit, and can be used in applications such as neuromorphic computing systems, machine learning systems and artificial intelligence (AI) applications that include a multiply-and-accumulate (MAC) step (i.e., sum-of-products function). The sum-of-products function can be expressed as the following equation (1):

$$f(x_i) = \sum_{i=1}^{M} W_i X_i \qquad (1)$$

In the equation (1), each term of the summation is the product of input $X_i$ times a weight $W_i$. The weight $W_i$ can differ over the terms of the summation. The weights can be assigned as a set of coefficients, and the summation changes as the inputs change. Also, in algorithms executing a learning procedure, the weights can be changed from time to time learning procedures change coefficients to learn from the summation. For instance, the weights are obtained via remote training in a computer, then downloaded to the integrated circuit 10. When model of the remote training is revised, new weights can be downloaded to the integrated circuit 10, thus the weights in the integrated circuit 10 can be updated.

The integrated circuit 10 includes a memory array 100 having a plurality of memory cells MC. In some embodiments, the memory array 100 is a three-dimensional memory array. As shown in FIG. 1A, each block of the memory cells MC may have multiple columns (or referred as strings) and rows (or referred as pages). In those embodiments where the integrated circuit 10 is a NAND flash memory circuit, the memory cells MC may be floating gate transistors, semiconductor-oxide-nitride-oxide-semiconductor (SONOS) transistors or the like. A column (string) of the memory cells MC are connected in series, and are connected between a bit line BL and a source line SL. In some embodiments, the source line SL is shared by multiple columns (strings) of the memory cells MC. On the other hand, a row (page) of the memory cells MC are connected by one of the word lines WL (e.g., including a word line WL1, a word line W2, a word line W3 . . . a word line Wn as shown in FIG. 1A). In some embodiments, the memory array 100 further includes string select switches SST and ground select switches GST. In these embodiments, each column (string) of the memory cells MC are connected between one of the string select switches SST and one of the ground select switches GST. The string select switches SST may be respectively connected to one of the bit lines BL, whereas the ground select switches GST may be connected to the source line SL. In addition, a row of the string select switches SST are connected by a string select line SSL, whereas a row of the ground select switches GST are connected by a ground select line GSL.

The integrated circuit 10 can be operated under a memory mode and a computation mode. In the memory mode, data can be written into or read from the memory cells MC using programing, erasing and read operations supported by components coupled to the memory array 100, such as decoders (not shown), a page buffer PB etc. During the programing operation, one of the word lines WL and some of the bit lines BL are selected, and data is written in to the memory cells MC corresponding to the selected word line WL and bit lines BL through the page buffer PB and the selected word line WL. On the other hand, during the read operation, data is read from the memory cells MC corresponding to a selected word line WL and some selected bit lines BL through the page buffer PB and the selected bit lines BL. In some embodiments, data is programmed to and read from a page of the memory cells MC during each programming operation and each read operation, respectively. In those embodiments where the integrated circuit 10 is configured to execute the sum-of-products function (as expressed in equation (1)), weights $W_i$ (e.g., weight $W_1$ and weight $W_2$ as shown in FIG. 1A) are assigned to the memory cells MC by multiple programming operations as describe above. The conductances or transconductances of the memory cells MC are determined by the weights $W_i$ written into the memory cells MC. In some embodiments, the memory cells MC are programmed by a binary mode, and the weights $W_i$ are stored as binary levels. In alternative embodiments, the weights $W_i$ are stored as multi-levels or analog codes. For instance, the multi-levels may be N levels, where N is an integer greater than 2.

In the computation mode of the integrated circuit 10, the weights $W_i$ stored in the memory cells MC are multiplied by input voltages $X_i$, and the products of the weights $W_i$ and the input voltages $X_i$ are summed up. In some embodiments, the bit lines BL in a block of the memory array 100 are configured to receive the input voltages $X_i$ (e.g., input voltage $X_1$ and input voltage $X_2$ as shown in FIG. 1A). In some embodiments, the input voltages $X_i$ are given with a pattern, and at least two of the input voltages $X_i$ are different from each other. For instance, the input voltages Xi are given by a binary mode, and the input voltage $X_1$ is at a high logic level "1", whereas the input voltage $X_2$ is at a low logic level "0". Alternatively, the input voltages $X_i$ may be given as multi-levels (e.g., N levels, where N is an integer greater than 2) or as analog codes. A selected one of the word lines WL in the block of the memory array 100 is configured to receive a read voltage, whereas others of the word lines WL in the block of the memory array 100 are configured to receive a pass voltage. In some embodiments, a page of the memory cells MC connected to the selected word line WL are turned on in corresponding to the read voltage, and the weights $W_i$ stored in these memory cells MC are multiplied by the input voltages $X_i$ when the input voltages $X_i$ are transmitted to these memory cells MC through the bit lines BL. In the embodiments where the input voltages $X_i$ are transmitted to the memory cells MC through the bit lines BL, the weights $W_i$ stored in the memory cells MC can be considered as conductances of the memory cells MC, and the products of the weights $W_i$ and the input voltages $X_i$ are output as current signals. Since the multiplication of the weights $W_i$ and the input voltages $X_i$ are taken place in the memory array 100, the multiplication operation can be considered as an in-memory computing.

In some embodiments, the products of the weights $W_i$ and the input voltages $X_i$ are output to the page buffer PB, which is coupled to the memory array 100 through the bit lines BL. Sense amplifiers (not shown) in the page buffer PB may be configured to sense those output current signals. In addition, counters CT coupled to the page buffer PB may be configured to sum up the output current signals (i.e., the products of the weights $W_i$ and the input voltages $X_i$). Although the page buffer PB and the counters CT are depicted in FIG. 1A as separate components, the page buffer PB and the counters CT may alternatively be integrated in a single component. The page buffer PB and the counters CT are disposed in a region surrounding the memory array 100, and are close to the memory array 100. Thereby, the summation operation executed by the page buffer PB and the counters CT can be considered as a near-memory computing.

Up to here, the sum-of-products function (as expressed in the equation (1)) is implemented via the in-memory computing of multiplying the weights $W_i$ and the input voltages $X_i$, as along with the near-memory computing of summing up the products of the weights $W_i$ and the input voltages $X_i$. As compared to a Von Neumann architecture that executes computation in a data processing unit (e.g., a central processing unit (CPU)) separated from a data storage unit (e.g., a memory integrated circuit), the integrated circuit 10 of the present disclosure can be operated under both of the memory mode and the computation mode. Thereby, shuttling information between the data processing unit and the data storage unit may no longer be required, and a computation speed can be significantly improved. Particularly, the page buffer PB used during writing the weights $W_i$ into the memory cells MC and during receiving the products of the weights $W_i$ and the input voltages $X_i$ has a wide bandwidth since it is coupled to the memory array 100 through a large amount of the bit lines BL with high parallelism. Therefore, a performance bottleneck when massive data is transmitted in the integrated circuit 10 may not occur. For instance, in binary mode, the page buffer PB may have a bandwidth greater than or equal to 32 kB.

Referring to FIG. 1A and FIG. 1B, a computation method of the integrated circuit 10 may include the following steps. In step S100, the weights $W_i$ are written into the memory cells MC by performing the programming operations described above.

In step S102, the input voltages $X_i$ are input to a page of the memory cells MC connected with a selected one of the word lines WL (e.g., the word line WL1). Accordingly, the multiplication of the weights $W_i$ and the input voltages $X_i$ takes place at the memory cells MC, and current signals are output through the bit lines BL and sensed by the page buffer PB. In step S104, the output current signals are summed up by, for example, the counters CT. The step S102 and the step S104 can be considered as a cycle of a sum-of-products function for a single page of the memory cells MC. Other cycles of the sum-of-products function (e.g., a cycle including step S102₁ and step S104₁, a cycle including step S102₂ and step S104₂ . . . a cycle including step S102$_n$ and step S104$_n$) for other pages of the memory cells MC are subsequently performed. In two consecutive cycles of the sum-of-products function for adjacent pages of the memory cells MC, one of the steps of inputting input voltages $X_i$ to two adjacent pages of the memory cells MC (e.g., the step S102₁) follows the other one of these steps (e.g., the step S102), and may be overlapped with the step of summing up the output current signals of the earlier cycle of the sum-of-products function (e.g., the step S104). Since some of the steps are overlapped in such pipeline timing flow design of the computation method of the integrated circuit 10, a computation speed of the integrated circuit 10 can be further improved.

Figure 2:
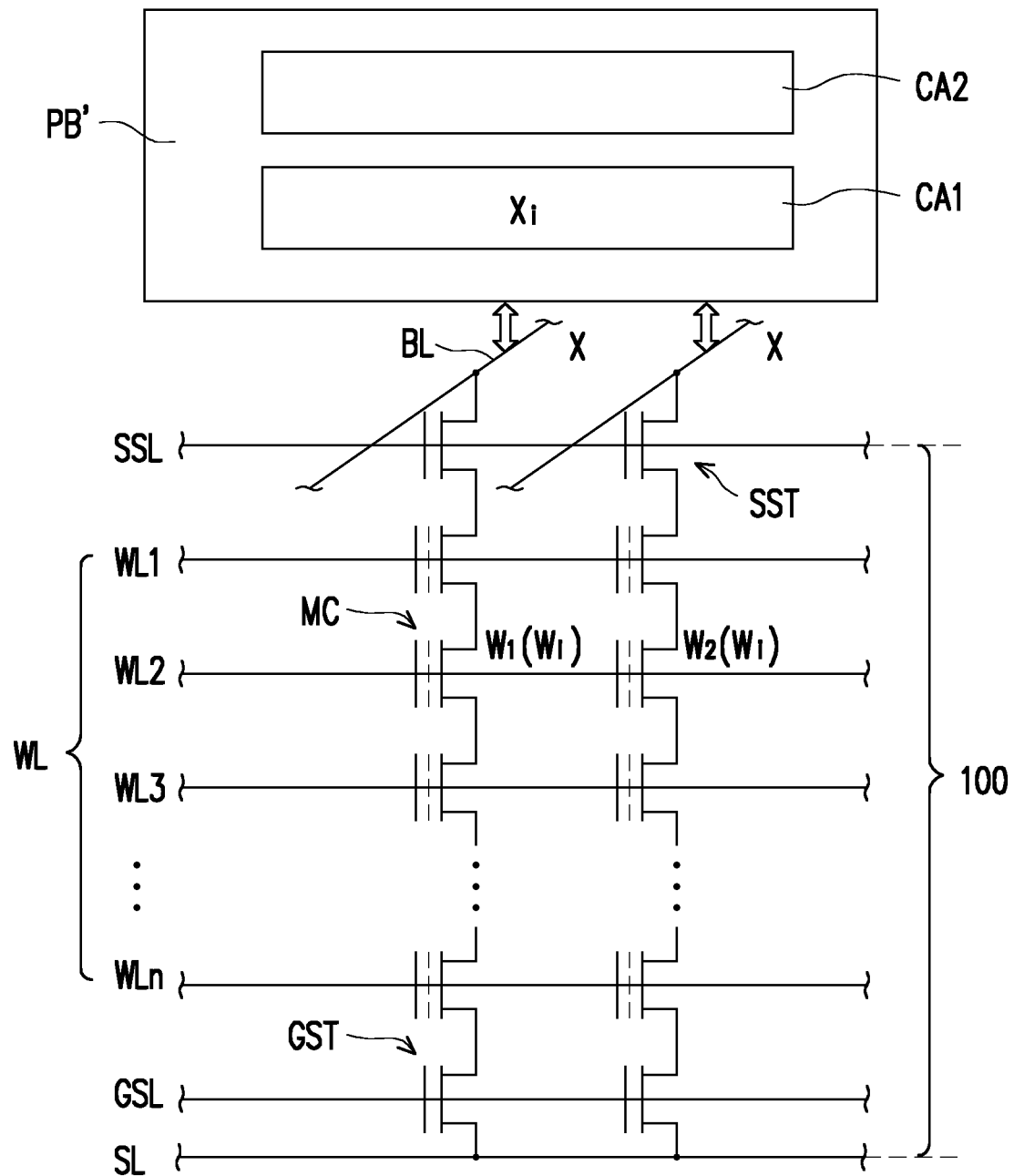
FIG. 2 is a schematic diagram illustrating an integrated circuit according to some embodiments of the present disclosure.

FIG. 2 is a schematic diagram illustrating an integrated circuit 10a according to some embodiments of the present disclosure. The integrated circuit 10a and a computation method thereof to be described with reference to FIG. 2 are similar to the integrated circuit 10 and a computation method thereof as described with reference to FIG. 1A and FIG. 1B. Only the differences therebetween will be elaborated, the same or the like parts will not be repeated hereinafter.

Referring to FIG. 2, in some embodiments, under the computation mode, the bit lines BL in a block of the memory array 100 are configured to receive identical input voltages X. In other words, in these embodiments, the input voltages X received by the bit lines BL are provided without a pattern. For instance, in binary mode, the bit lines BL may all configured to receive the input voltages X of a logic high level "1". In this way, the weights Wi stored in the memory cells MC are multiplied by the identical input voltages X, and the output current signals are transformed to logic signals (e.g., "1" and "0") by a sense amplifier (not shown) and provided to the page buffer PB'. In some embodiments, the page buffer PB' includes a first cache CA1 and a second cache CA2. The first cache CA1 is configured to store the above mentioned logic signals (hereinafter, first logic signals), and is pre-written with additional logic signals (hereinafter, second logic signals) transformed from input voltages $X_i$. These input voltages $X_i$ are provided with a pattern. In other words, at least two of the input voltages $X_i$ are different from each other. In binary mode, one of the input voltages $X_i$ can be transformed to a logic high signal "1", whereas another one of the input voltages $X_i$ can be transformed to a logic low level signal "0". Subsequently, counters (not shown) in the second cache CA2 are configured to perform a MAC calculation. In other words, the second cache CA2 is configured to multiply the first and second logic signals, and sum up the products of the first and second logic signals. Up to here, the sum-of-products function is implemented via the multiplication operation and the summation operation, which are both performed in the page buffer PB' and can be considered as a near-memory computing.

Figure 3:
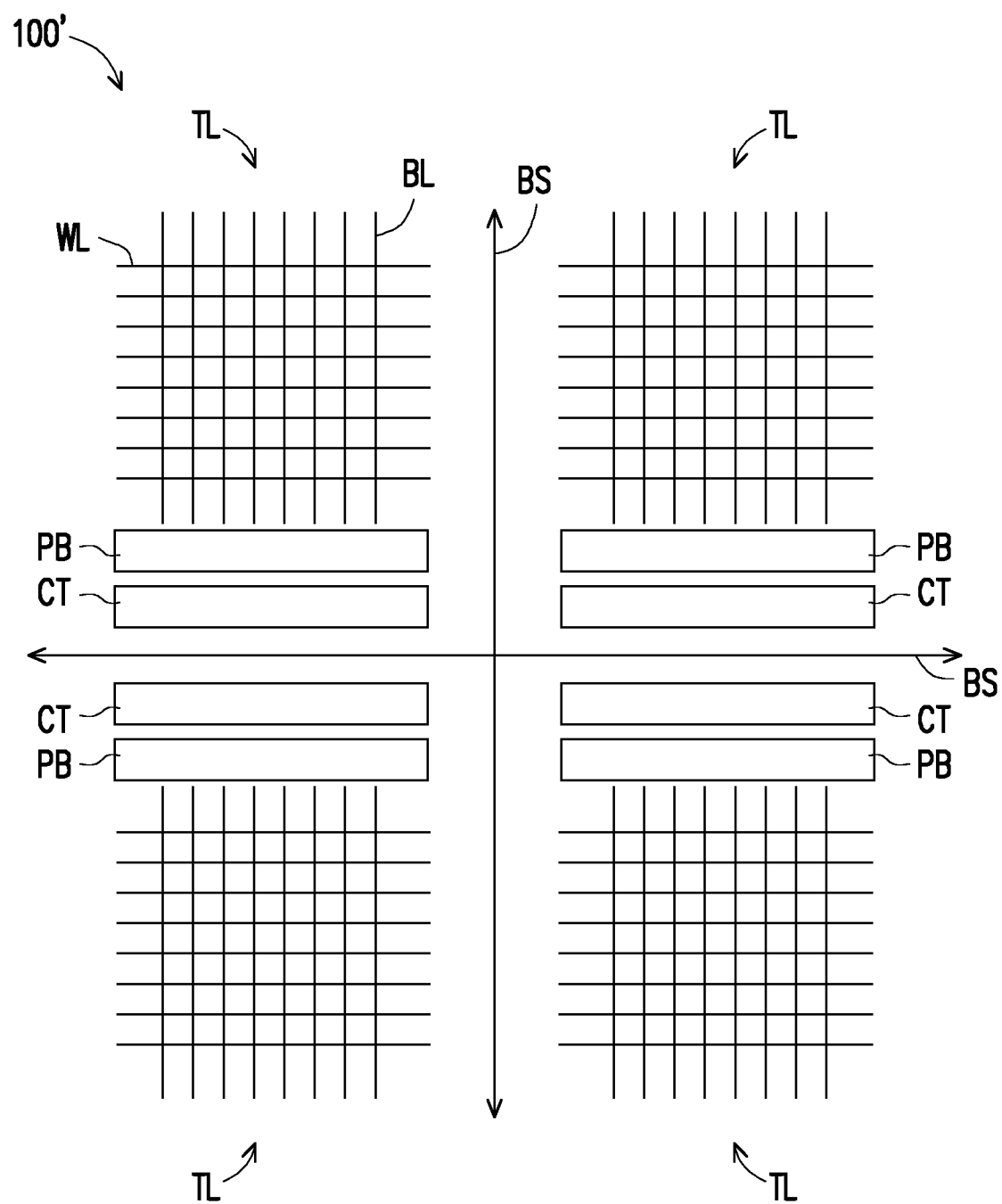
FIG. 3 is a schematic diagram illustrating an integrated circuit according to some embodiments of the present disclosure.

FIG. 3 is a schematic diagram illustrating an integrated circuit 10b according to some embodiments of the present disclosure. The integrated circuit 10b and a computation method thereof to be described with reference to FIG. 3 are similar to the integrated circuit 10 and a computation method thereof as described with reference to FIG. 1A and FIG. 1B. Only the differences therebetween will be elaborated, the same or the like parts will not be repeated hereinafter.

Referring to FIG. 3, in some embodiments, a block of the memory array 100' in the integrated circuit 10b is divided into a plurality of tiles TL (e.g., 4 tiles TL). Each tile TL includes a portion of the memory array 100', and the tiles TL are physically separated from each other. It should be noted that, for conciseness, only the bit lines BL and the word lines WL in each of the tiles TL are exemplarily depicted in FIG. 3, whereas other components (e.g., the memory cells MC, the string select switches SST, the ground select switches GST, the sting select line SSL and the ground select line GSL as shown in FIG. 1A) are omitted. The tiles TL are arranged in an array along multiple columns and multiple rows. In some embodiments, an inter-tile bus system BS extending between the tiles TL is coupled to the tiles TL, and may be coupled to a sequencing controller (not shown). In addition, each of the tiles TL is coupled to a peripheral circuit including a page buffer PB and counters CT. In some embodiments, the peripheral circuits coupled to adjacent tiles TL in the same column may face each other, and the peripheral circuits coupled to adjacent tiles TL in the same row may be located at the same side of these tiles TL. However, those skilled in the art may adjust an amount of the tiles TL and a configuration of the peripheral circuits according to design requirements, the present disclosure is not limited thereto. Moreover, in some embodiments, each of the tiles TL is coupled to a row decoder and a column decoder (both not shown). By dividing the memory array 100' into multiple tiles TL, an RC-delay of the integrated circuit 10b can be reduced, and a computation speed of the integrated circuit 10b can be further improved.

Figure 4:
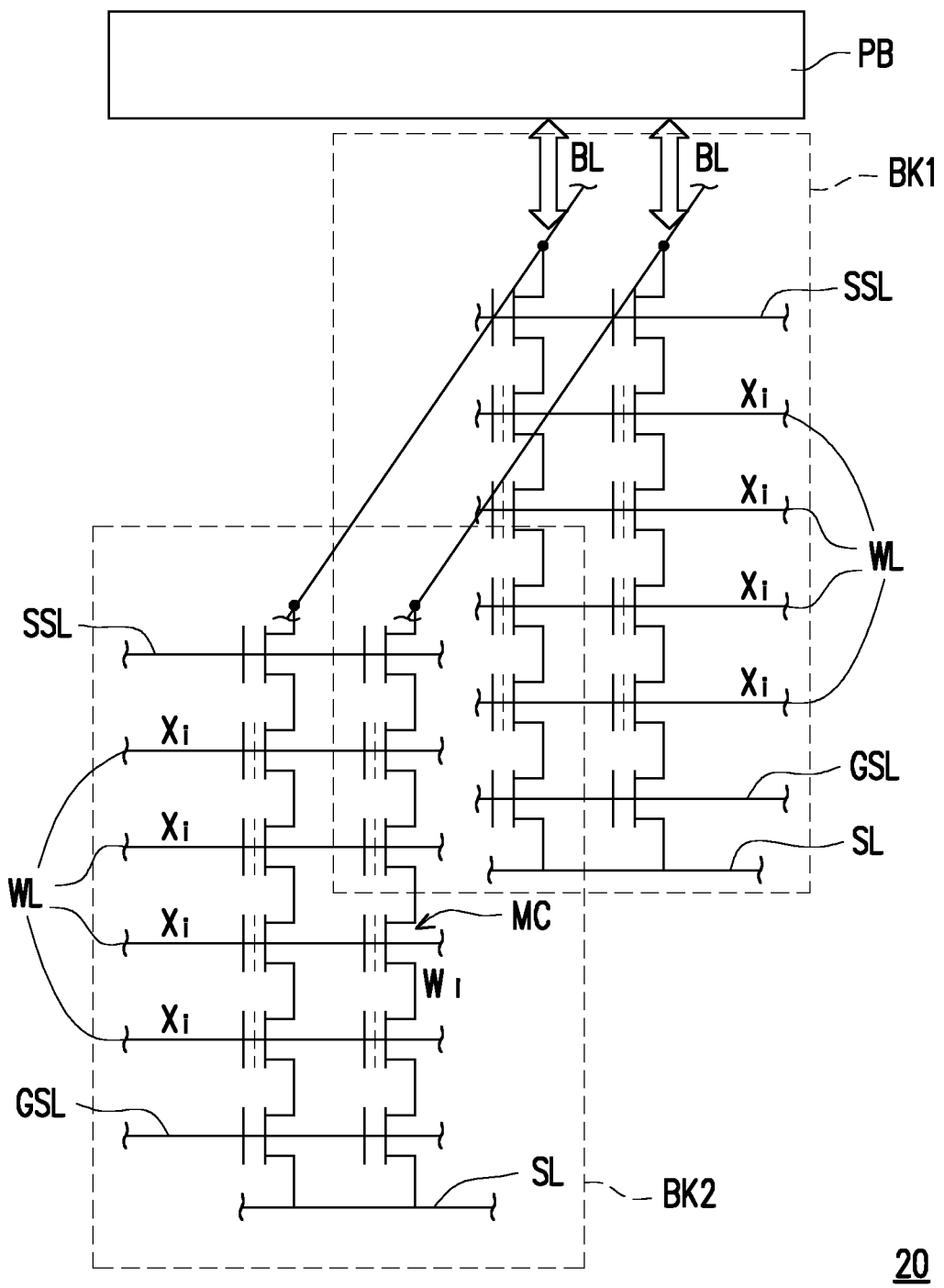
FIG. 4 is a schematic diagram illustrating an integrated circuit according to some embodiments of the present disclosure.

FIG. 4 is a schematic diagram illustrating an integrated circuit 20 according to some embodiments of the present disclosure. The integrated circuit 20 and a computation method thereof to be described with reference to FIG. 4 are similar to the integrated circuit 10 and a computation method thereof as described with reference to FIG. 1A and FIG. 1B. Only the differences therebetween will be elaborated, the same or the like parts will not be repeated hereinafter.

Referring to FIG. 4, multiple blocks (e.g., a block BK1 and a block BK2) of a memory array 200 in the integrated circuit 20 are illustrated. Each block of the memory array 200 is similar to the block of the memory array 100 as illustrated in FIG. 1A, and has multiple columns (strings) and multiple rows (pages) of the memory cells MC. Each row of the memory cells MC are connected with one of the word lines WL, whereas each column (string) of the memory cells MC is connected between a bit line BL and a source line SL. In some embodiments, multiple columns (strings) of the memory cells MC in the same block share the same source line SL. In addition, word lines WL in one of the blocks (e.g., the block BK1) are isolated from another one of the blocks (e.g., the block BK2), whereas bit lines BL are shared by different blocks (e.g., the block BK1 and the block BK2). In some embodiments, the source lines SL of different blocks are coupled together. In alternative embodiments, the source line SL of one of the blocks (e.g., the block BK1) is isolated from the source line SL of another one of the blocks (e.g., the block BK2).

Under the memory mode of the integrated circuit 20, the weights $W_i$ are written into the memory cells MC of the memory array 200 by the programming operations described with reference to FIG. 1A. On the other hand, under the computation mode of the integrated circuit 20, a plurality of the word lines WL in different blocks and one of the bit lines BL shared by different blocks are selected. The selected word lines WL are configured to receive the input voltages $X_i$. In some embodiments, the input voltages $X_i$ are given with a pattern, and at least two of the input voltages $X_i$ are different from each other. For instance, in binary mode, one of the input voltages $X_i$ is at a logic high level "1", and another one of the input voltages Xi is at a logic low level "0". In addition, the selected bit line BL is configured to receive a read voltage, whereas others of the bit lines BL are configured to receive a pass voltage (e.g., 0V). The weights $W_i$ stored in the memory cells MC corresponding to the selected word lines WL and bit line BL are multiplied by the input voltages $X_i$ at these memory cells MC. In the embodiments where the input voltages $X_i$ are transmitted to the memory cells MC through the word lines WL, the weights $W_i$ stored in the memory cells MC can be considered as transconductances of the memory cells MC. Products of the weights $W_i$ and the input voltages $X_i$ are output as current signals through the selected bit line BL. Since each of the bit lines BL in the memory array 200 are shared by different blocks, the output current signals from different blocks are summed up in the same bit line BL. In some embodiments, the summation of the products of the weights $W_i$ and the input voltages $X_i$ are sensed by the page buffer PB coupled to the memory array 200.

Based on the configuration of the integrated circuit 20 as shown in FIG. 4, the multiplication operation is performed at the memory cells MC, and the summation operation is performed through the selected bit line BL. Therefore, each of the multiplication operation and the summation operation can be considered as an in-memory computing.

In those embodiments illustrated with reference to FIG. 4, the memory cells MC may not be over-erased before they are subject to the programming operations. That is, in some embodiments where each of the memory cells MC is an n-type transistor, a threshold voltage of the erased memory cells MC is equal to or greater than 0V. In this way, under the computation mode, the memory cells MC corresponding to the unselected word lines WL may receive a pass voltage of, for example, 0V, and can be fully turned off. Therefore, the output current signals may be only contributed by the memory cells MC corresponding to the selected word line WL and bit lines BL. Thus, a reliability of the integrated circuit 20 can be improved.

As above, the integrated circuit of the present disclosure can be operated under a memory mode and a computation mode. The integrated circuit includes a memory array, such as a NAND flash memory array. A sum-of-products function can be implemented by the integrated circuit, and may be used in a learning procedure of artificial intelligence applications, neuromorphic computing systems and machine learning systems. Under the memory mode, weights are written into the memory cells of the memory array. Under the computation mode, the stored weights are multiplied by input voltages transmitted to the memory cells through bit lines or word lines, and the products of the weights and the input voltages are summed up. As compared to a Von Neumann architecture that executes computation in a data processing unit (e.g., a central processing unit (CPU)) separated from a data storage unit (e.g., a memory integrated circuit), the integrated circuit in the present disclosure that can be operated under both of the memory mode and the computation mode does not require shuttling information between the data processing unit and the data storage unit. Thus, a computation speed can be significantly raised. Particularly, the page buffer used during writing the weights into the memory cells and during receiving the products of the weights and the input voltages has a wide bandwidth since it is coupled to the memory array through a large amount of the bit lines with high parallelism. Therefore, a performance bottleneck when massive data is transmitted in the integrated circuit may not occur.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An integrated circuit, comprising:
a memory array, comprising a plurality of memory cells, wherein each of the memory cells is a flash transistor, and configured to be independently programmed with a weight;
a plurality of word lines and a plurality of bit lines, wherein the plurality of word lines respectively connect a row of the plurality of memory cells, the plurality of bit lines are respectively connected with a column of the plurality of memory cells that are connected in series, more than one of the plurality of bit lines in a block of the memory array or more than one of the plurality of word lines in multiple blocks of the memory array are configured to receive input voltages, and the memory cells receiving the input voltages are configured to multiply the weights stored therein and the received input voltages; and
a page buffer, coupled to the memory array, and configured to sense products of the weights and the input voltages.

2. The integrated circuit according to claim 1, wherein the input voltages are received by the more than one of the plurality of the bit lines in a block of the memory array, and one of the plurality of word lines in the block of the memory array is configured to receive a read voltage, whereas others of the plurality of word lines in the block of the memory array are configured to receive a pass voltage.

3. The integrated circuit according to claim 2, wherein the memory cells corresponding to the more than one of the plurality of the bit lines and the one of the plurality of word lines are configured to multiply the weights stored therein and the received input voltages, and to produce the products.

4. The integrated circuit according to claim 3, further comprising a counter, coupled to the page buffer, and configured to sum up the products.

5. The integrated circuit according to claim 2, wherein at least two of the input voltages are different from each other.

6. The integrated circuit according to claim 2, wherein the input voltages are identical with one another.

7. The integrated circuit according to claim 6, wherein the page buffer comprises a first cache and a second cache, the first cache is configured to receive first logic signals transformed from the products of the weights and the input voltages, and to be pre-written with second logic signals transformed from additional input voltages, the second cache is configured to multiply the first and second logic signals, and sum up products of the first and second logic signals.

8. The integrated circuit according to claim 7, wherein at least two of the additional input voltages are different from each other and transformed to different logic signals.

9. The integrated circuit according to claim 1, wherein the input voltages are received by the more than one of the plurality of word lines in multiple blocks of the memory array, the word lines in different ones of the multiple blocks of the memory array are isolated from one another, the plurality of bit lines are respectively shared by the multiple blocks of the memory array, and one of the plurality of bit lines is configured to receive a read voltage, whereas others of the plurality of bit lines are configured to receive a pass voltage.

10. The integrated circuit according to claim 9, wherein the memory cells corresponding to the more than one of the plurality of word lines and the one of the plurality of bit lines are configured to multiply the weights stored therein and the received input voltages, and to produce the products.

11. The integrated circuit according to claim 10, wherein the products are summed up in the one of the plurality of bit lines.

12. The integrated circuit according to claim 10, wherein the memory cells corresponding to the more than one of the plurality of word lines and the one of the plurality of bit lines have a threshold voltage equal to or greater than 0 V.

13. The integrated circuit according to claim 1, wherein the memory array is a NAND flash memory array.

14. The integrated circuit according to claim 1, wherein an amount of the page buffer is plural, and a block of the memory array has a plurality tiles, respectively coupled with one of the page buffers.

15. A computing method of an integrated circuit, wherein the integrated circuit comprises a memory array, a plurality of word lines, a plurality of bit lines and a page buffer, the memory array comprises a plurality of memory cells, each formed by a flash transistor, the plurality of word lines respectively connect a row of the plurality of memory cells, the plurality of bit lines are respectively connected with a column of the plurality of memory cells that are connected in series, the page buffer is coupled to the memory array, and the computing method of the integrated circuit comprise:

performing at least one programming operations, to write weights into the plurality of memory cells, wherein each of the plurality of memory cells is independently written with one of the weights;

applying input voltages to more than one of the plurality of bit lines in a block of the memory array or to more than one of the plurality of word lines in multiple blocks of the memory array, wherein the memory cells receiving the input voltages are configured to multiply the weights stored therein and the received input voltages; and summing up the products of the weights and the input voltages by the page buffer or through one of the plurality of bit lines.

16. The computing method of the integrated circuit according to claim 15, wherein a cycle comprising the operation of applying the input voltages and the operation of summing up the products are performed multiple times.

17. The computing method of the integrated circuit according to claim 16, wherein the operation of applying the input voltages in one of the cycles is followed by the operation of applying the input voltages in a subsequent one of the cycles.

18. The computing method of the integrated circuit according to claim 16, wherein the operation of applying the input voltages in one of the cycles is overlapped with the operation of summing up the products in a precedent one of the cycles.

19. The computing method of the integrated circuit according to claim 15, wherein the input voltages are applied to the more than one of the plurality of bit lines in a block of the memory array, and the products of the weights and the input voltages are summed up by the page buffer.

20. The computing method of the integrated circuit according to claim 15, wherein the input voltages are applied to the more than one of the plurality of word lines in multiple blocks of the memory array, and the products of the weights and the input voltages are summed up through the one of the bit lines.

* * * * *